(12) United States Patent
Shimabe et al.

(10) Patent No.: US 9,859,221 B2
(45) Date of Patent: Jan. 2, 2018

(54) MULTILAYER WIRING BOARD WITH BUILT-IN ELECTRONIC COMPONENT

(71) Applicant: IBIDEN CO., LTD., Ogaki (JP)

(72) Inventors: Toyotaka Shimabe, Ogaki (JP); Toshiki Furutani, Ogaki (JP); Shunsuke Sakai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 10 days.

(21) Appl. No.: 14/626,085

(22) Filed: Feb. 19, 2015

(65) Prior Publication Data

US 2015/0245492 A1 Aug. 27, 2015

(30) Foreign Application Priority Data

Feb. 21, 2014 (JP) ................................. 2014-032155

(51) Int. Cl.
*H05K 1/18* (2006.01)
*H01L 23/538* (2006.01)
(Continued)

(52) U.S. Cl.
CPC ...... *H01L 23/5389* (2013.01); *H01L 21/4857* (2013.01); *H01L 24/24* (2013.01); *H01L 24/25* (2013.01); *H01L 24/82* (2013.01); *H05K 1/185* (2013.01); *H01L 21/568* (2013.01); *H01L 2224/04105* (2013.01); *H01L 2224/16225* (2013.01); *H01L 2224/24137* (2013.01); *H01L 2224/2518* (2013.01); *H01L 2224/82039* (2013.01); *H01L 2924/153* (2013.01); *H01L 2924/19041* (2013.01); *H01L 2924/19042* (2013.01); *H01L 2924/19043* (2013.01); *H01L 2924/19105* (2013.01); *H05K 3/4602* (2013.01); *H05K 2201/09827* (2013.01);
(Continued)

(58) Field of Classification Search
USPC .......................... 361/763–766, 784, 792–795
See application file for complete search history.

(56) References Cited

U.S. PATENT DOCUMENTS 6,388,207 B1 * 5/2002 Figueroa ........... H01L 23/49805
174/261
6,512,182 B2 * 1/2003 Takeuchi ............... H01L 21/568
174/255

(Continued)

FOREIGN PATENT DOCUMENTS

JP 2001-313474 A 11/2001

*Primary Examiner* — Tuan T Dinh
(74) *Attorney, Agent, or Firm* — Oblon, McClelland, Maier & Neustadt, L.L.P.

(57) ABSTRACT

A multilayer wiring board with built-in electronic components includes a substrate including an insulating material and having multiple opening portions, a first conductor layer formed on a surface of the substrate and having an opening portion such that the substrate has the opening portions inside the opening portion of the first conductor layer, multiple electronic components positioned in the opening portions of the substrate, and an insulating layer formed on the substrate such that the insulating layer is formed on the electronic components and on the first conductor layer. The opening portions are formed in the substrate such that the opening portions include two opening portions and that the substrate has a partition wall formed between the two opening portions.

20 Claims, 20 Drawing Sheets

(51) Int. Cl.
*H01L 23/00* (2006.01)
*H01L 21/48* (2006.01)
H01L 21/56 (2006.01)
H05K 3/46 (2006.01)

(52) U.S. Cl.
CPC .............. *H05K 2201/09972* (2013.01); *H05K 2201/10522* (2013.01); *H05K 2201/10636* (2013.01); *Y02P 70/611* (2015.11)

(56) References Cited

U.S. PATENT DOCUMENTS

2012/0287586 A1* 11/2012 Mikado ................. H05K 1/185
 361/748
2013/0182401 A1* 7/2013 Furutani .............. H05K 1/0296
 361/782

* cited by examiner

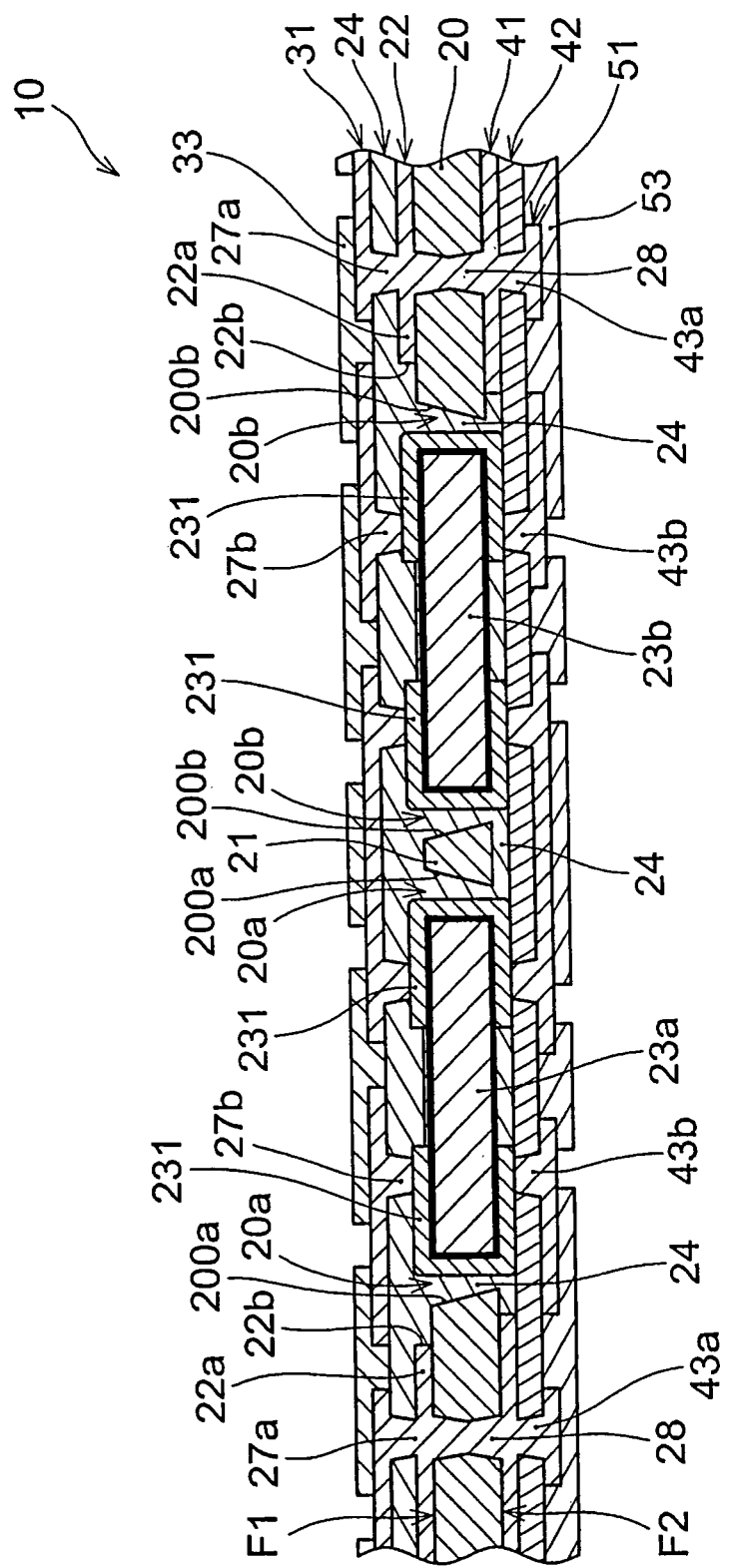

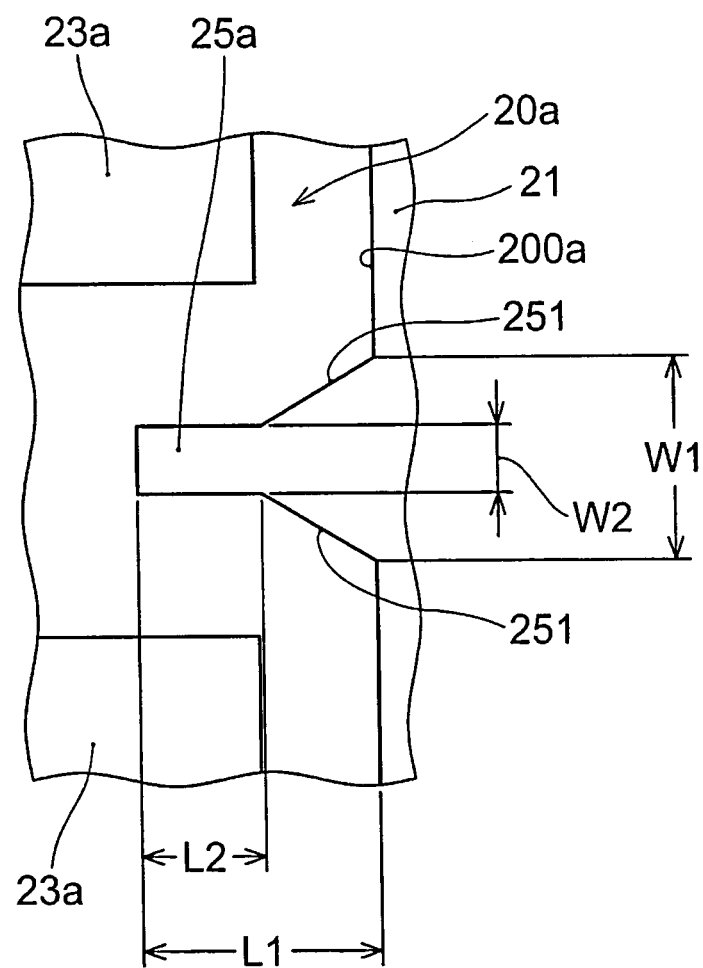

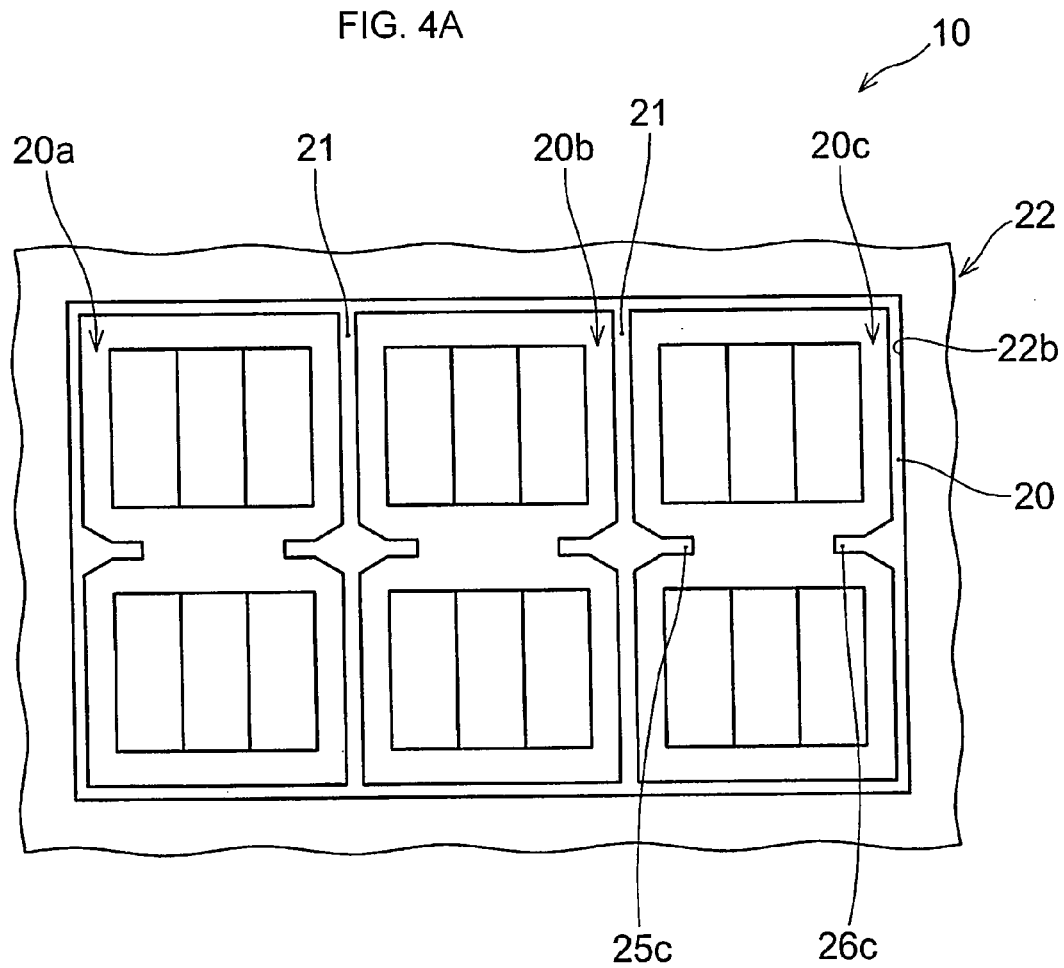

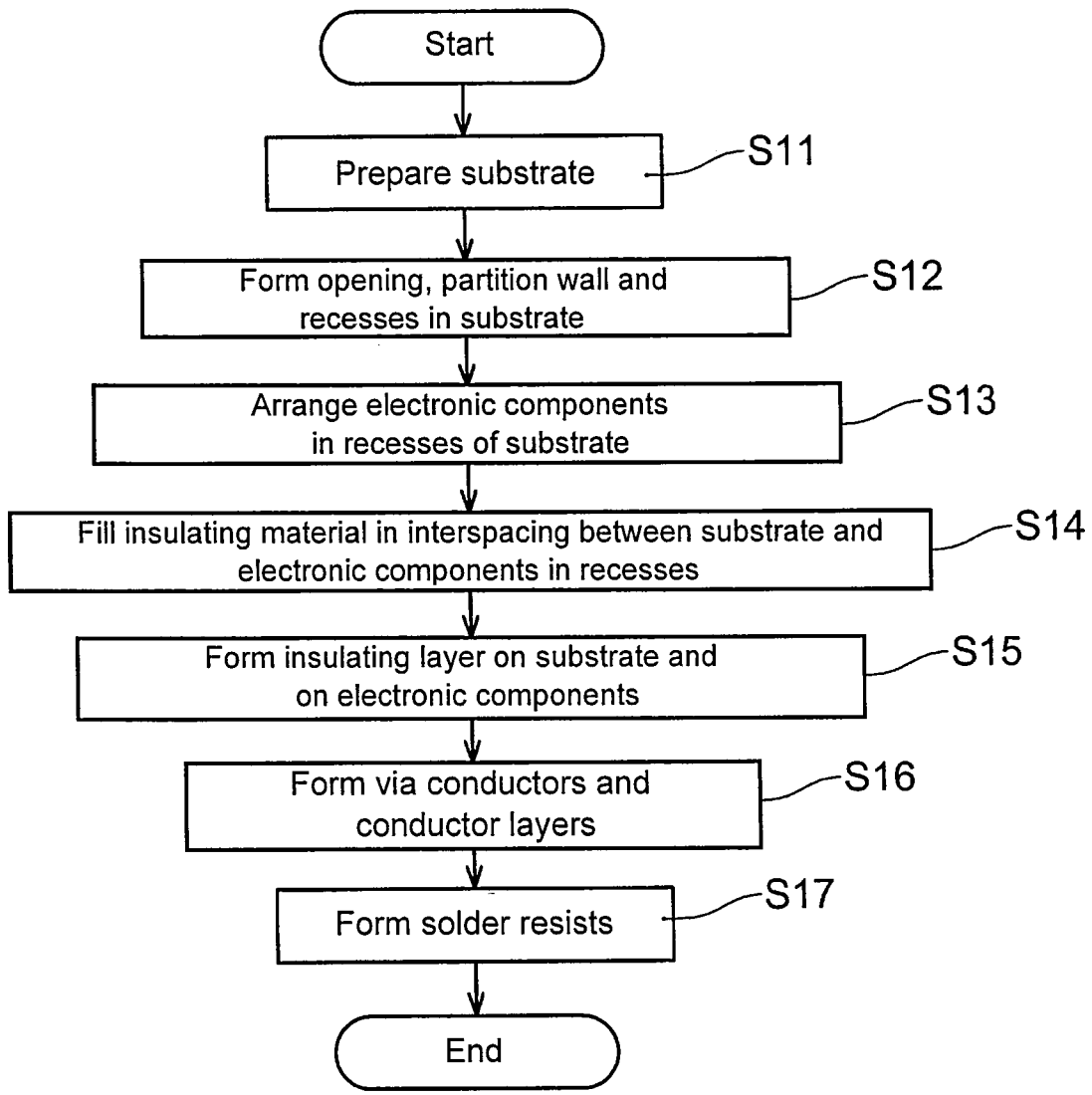

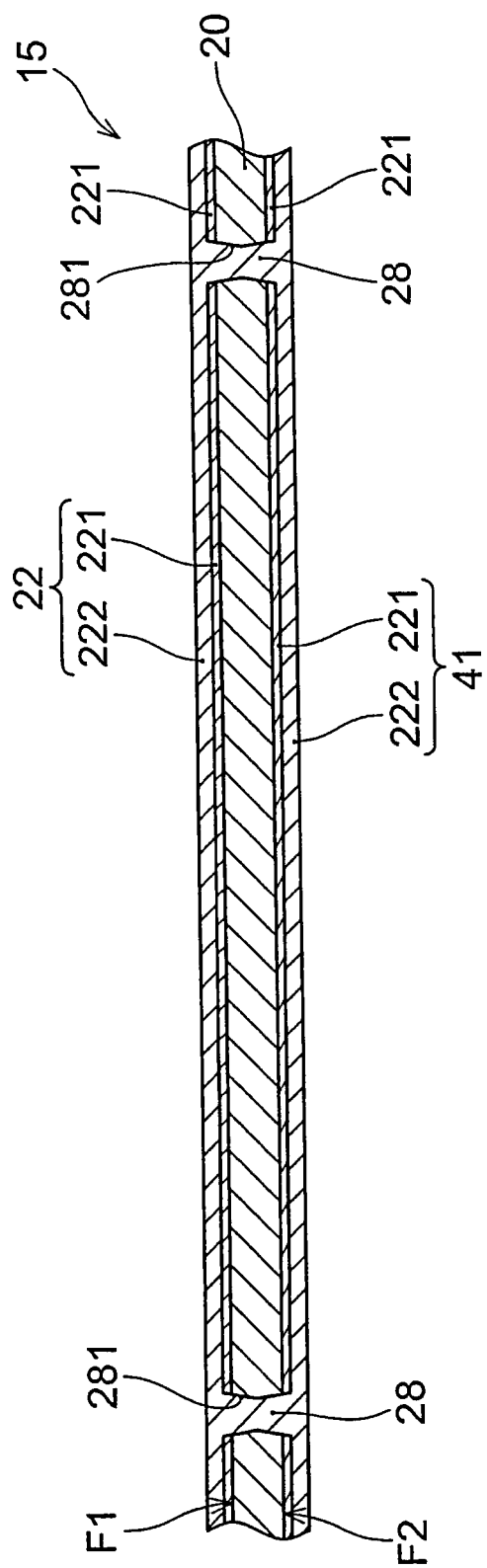

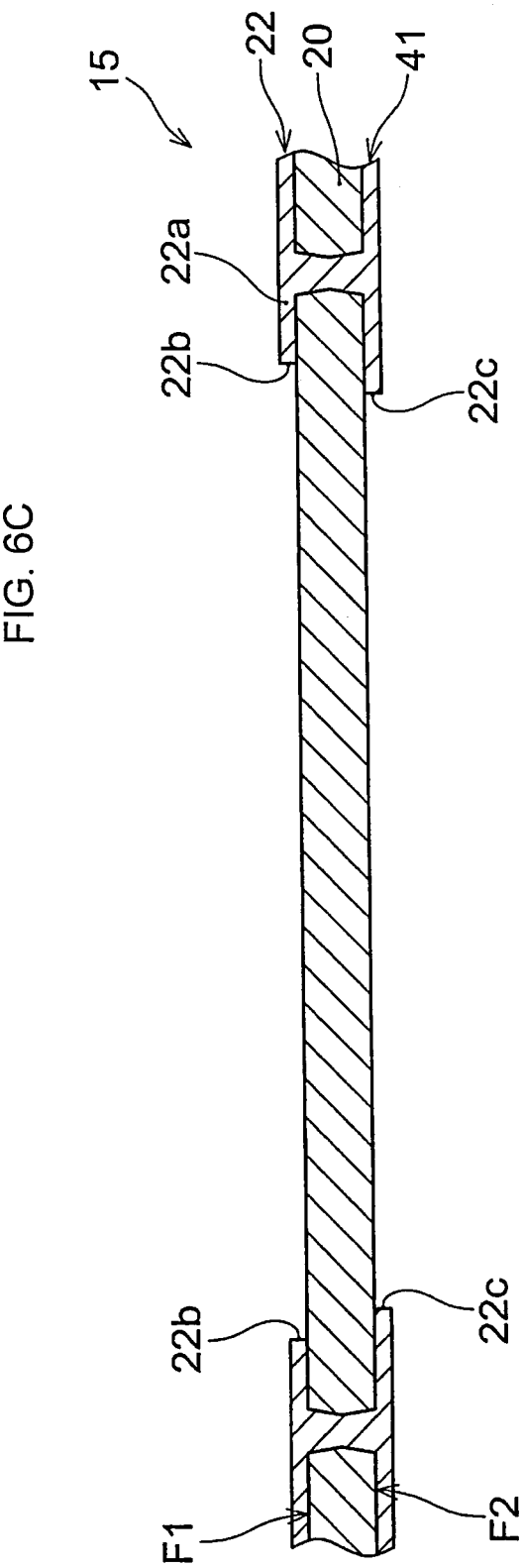

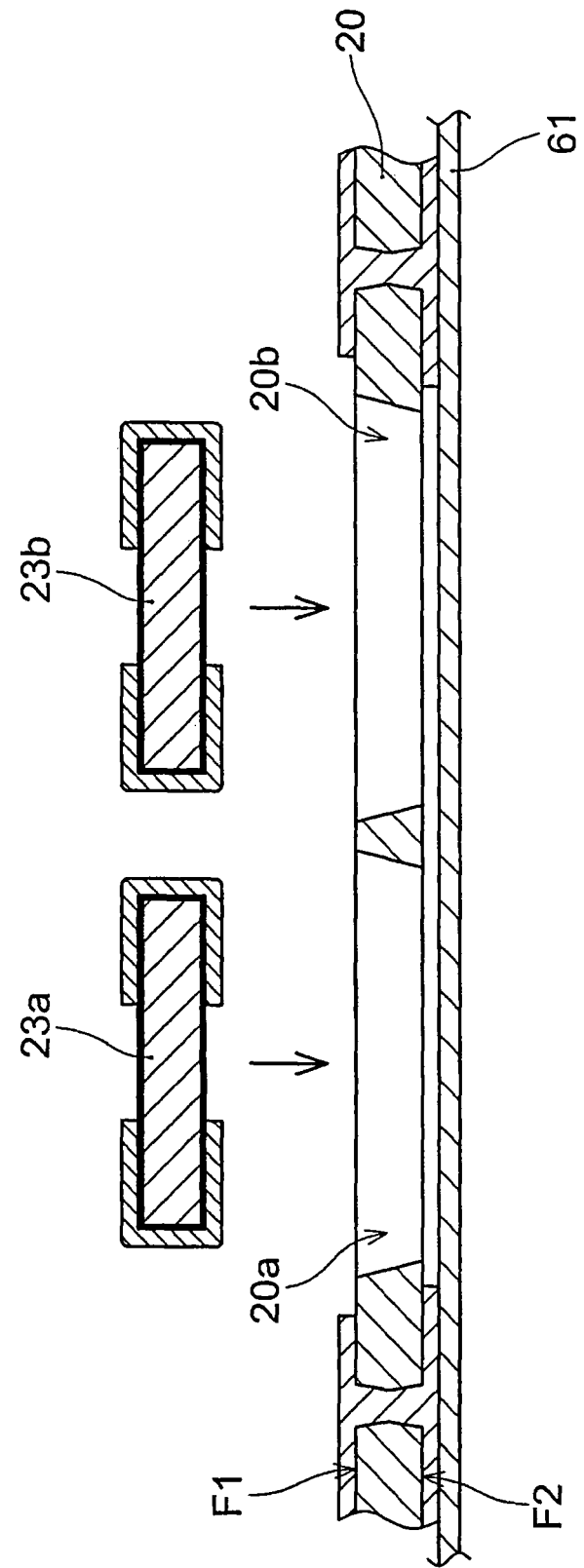

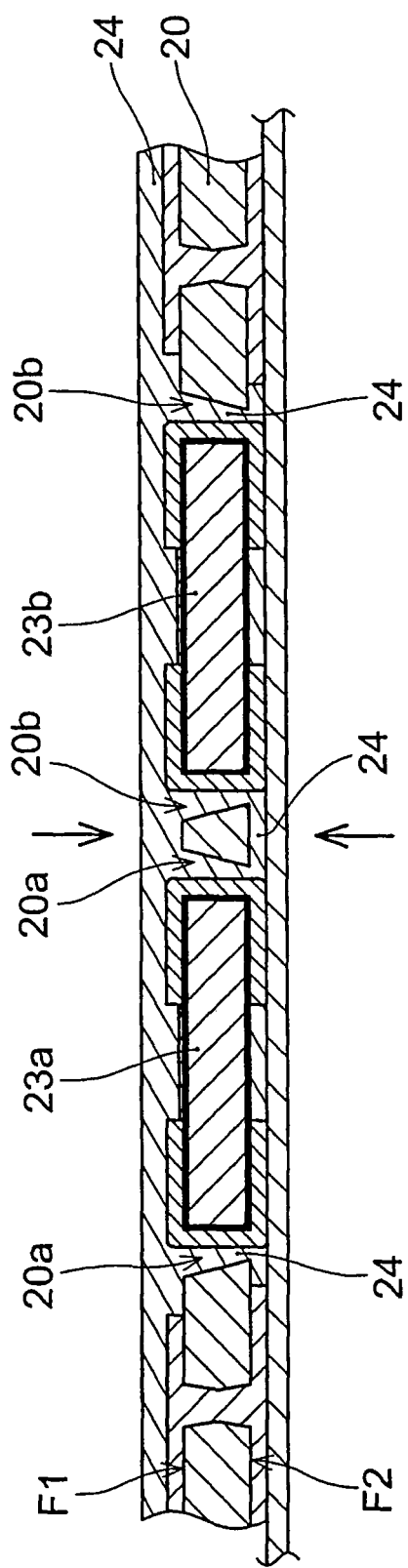

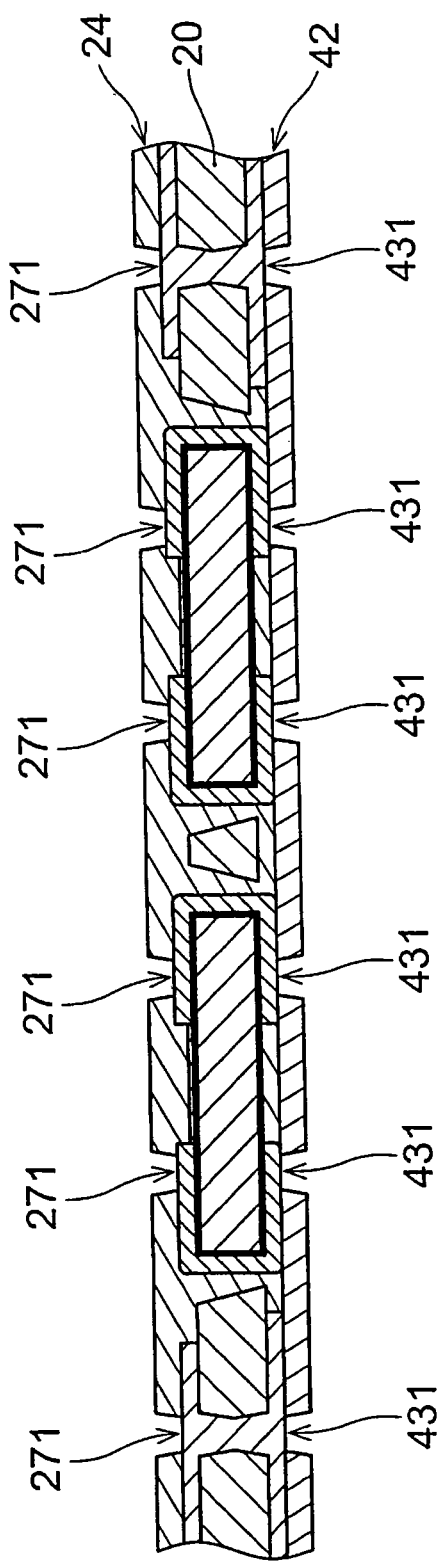

MULTILAYER WIRING BOARD WITH BUILT-IN ELECTRONIC COMPONENT

CROSS-REFERENCE TO RELATED APPLICATIONS

The present application is based upon and claims the benefit of priority to Japanese Patent Application No. 2014-032155, filed Feb. 21, 2014, the entire contents of which are incorporated herein by reference.

BACKGROUND OF THE INVENTION

Field of the Invention

The present invention relates to a multilayer wiring board with a built-in electronic component.

Description of Background Art

Japanese Patent Laid-Open Publication No. 2001-313474 describes a multilayer wiring board with built-in electronic components, which includes a wiring substrate body in which a through hole is provided, electronic components that are arranged in the through hole, an insulating layer that is formed around the electronic components, a conductor layer that is formed on an upper part and a lower part of the insulating layer, and a via conductor that connects the conductor layer and electrodes of the electronic components. The entire contents of this publication are incorporated herein by reference.

SUMMARY OF THE INVENTION

According to one aspect of the present invention, a multilayer wiring board with built-in electronic components includes a substrate including an insulating material and having multiple opening portions, a first conductor layer formed on a surface of the substrate and having an opening portion such that the substrate has the opening portions inside the opening portion of the first conductor layer, multiple electronic components positioned in the opening portions of the substrate, and an insulating layer formed on the substrate such that the insulating layer is formed on the electronic components and on the first conductor layer. The opening portions are formed in the substrate such that the opening portions include two opening portions and that the substrate has a partition wall formed between the two opening portions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A illustrates a cross-sectional view along a line A-A in FIG. 1;

FIG. 3 illustrates an enlarged view of a projection in the multilayer wiring board (illustrated in FIG. 1) with a built-in electronic component;

FIG. 4A illustrates a plan view of a modified embodiment of the multilayer wiring board (illustrated in FIG. 1) with a built-in electronic component;

FIG. 5 illustrates a flowchart of a manufacturing method of the multilayer wiring board (illustrated in FIG. 1) with a built-in electronic component;

FIG. 6B illustrates an explanatory diagram of respective processes of the manufacturing method of the multilayer wiring board (illustrated in FIG. 1) with a built-in electronic component;

FIG. 6C illustrates an explanatory diagram of respective processes of the manufacturing method of the multilayer wiring board (illustrated in FIG. 1) with a built-in electronic component;

FIG. 6G illustrates an explanatory diagram of respective processes of the manufacturing method of the multilayer wiring board (illustrated in FIG. 1) with a built-in electronic component;

FIG. 6H illustrates an explanatory diagram of respective processes of the manufacturing method of the multilayer wiring board (illustrated in FIG. 1) with a built-in electronic component;

FIG. 6J illustrates an explanatory diagram of respective processes of the manufacturing method of the multilayer wiring board (illustrated in FIG. 1) with a built-in electronic component;

DETAILED DESCRIPTION OF THE EMBODIMENTS

Figure 1:
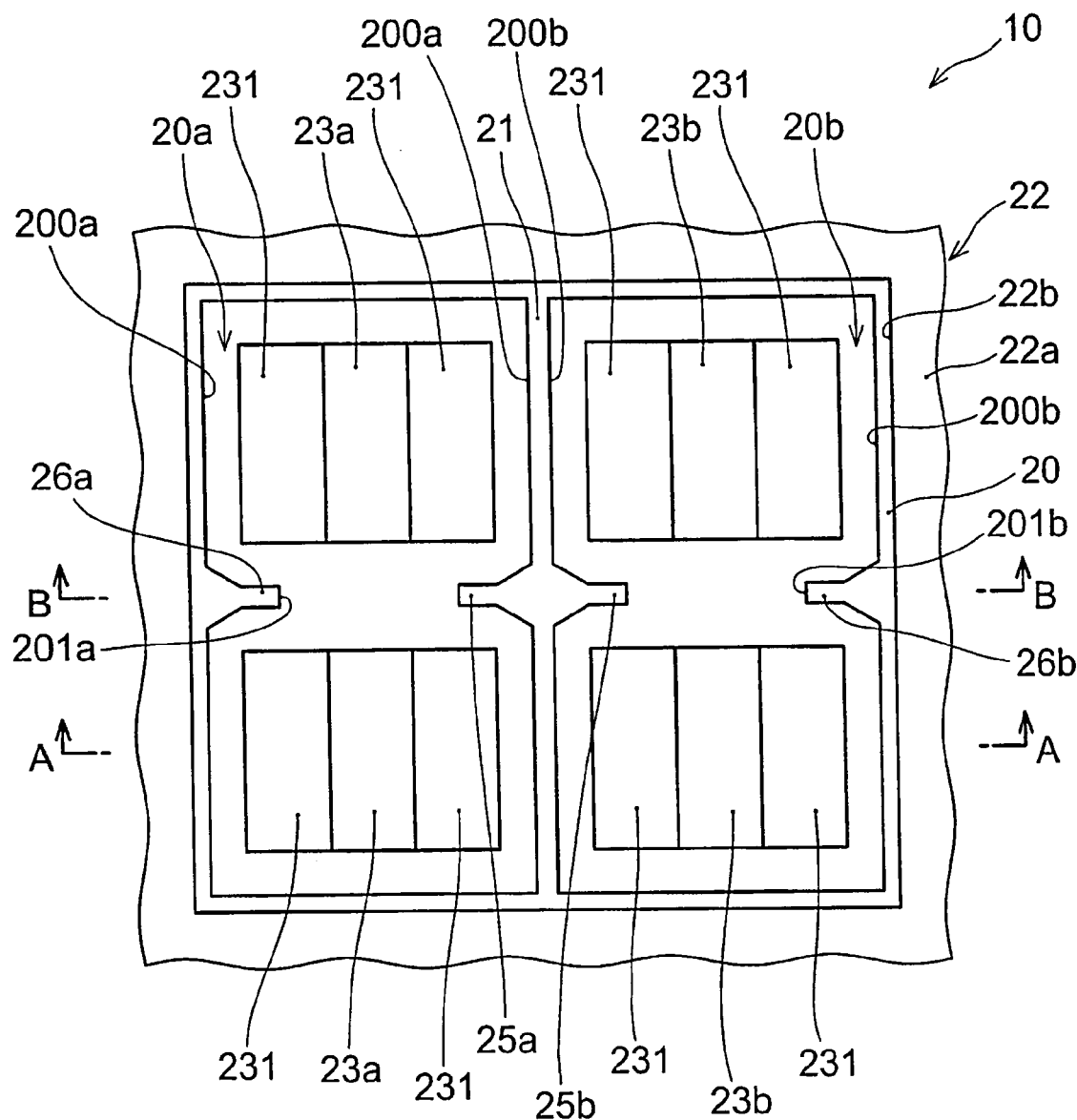
FIG. 1 illustrates a plan view of a through hole, in which an electronic component is provided, in a multilayer wiring board with a built-in electronic component of an embodiment of the present invention.

The embodiments will now be described with reference to the accompanying drawings, wherein like reference numerals designate corresponding or identical elements throughout the various drawings.

A multilayer wiring board with a built-in electronic component according to an embodiment of the present invention is described with reference to the drawings. In the following description, a layer close to a substrate of the multilayer wiring board with a built-in electronic component of the embodiment of the present invention is referred to as a lower layer or an inner layer, and a layer far away from the substrate is referred to as an upper layer or an outer layer.

The multilayer wiring board 10 with a built-in electronic component of the present embodiment (hereinafter, the multilayer wiring board with a built-in electronic component is simply referred to as a "wiring board"), as illustrated in FIGS. 1 and 2A, includes a substrate 20, a first conductor layer 22 that is formed on a surface of the substrate 20, through holes (20a, 20b) that are formed in the substrate 20, electronic components (23a) that are positioned in the through hole (20a) of the substrate 20, electronic components (23b) that are positioned in the through hole (20b) of the substrate 20, and an insulating layer 24 that is formed on the electronic components (23a, 23b), on the substrate 20 and on the first conductor layer 22. FIG. 1 illustrates a state before the insulating layer 24 is formed. In the present embodiment, the through holes (20a, 20b) are respectively formed in one opening (22b), where a conductor pattern (22a) of the first conductor layer 22 is not provided, using the substrate 20 as a partition wall 21. In the present embodiment, two electronic components (23a) are provided in the through hole (20a). Similarly, two electronic components (23b) are provided in the through hole (20b). Positional displacements of the electronic components (23a) and the electronic components (23b) in a direction in which they approach each other are suppressed by the partition wall 21. As a result, short-circuiting between electrodes 231 of the electronic components (23a) and electrodes 231 of the electronic components (23b) is prevented. Further, connection failures in the electrodes 231 of the electronic components (23a, 23b) are reduced. In the present embodiment, as illustrated in FIG. 2A, inner wall surfaces (200a, 200b) of the through holes (20a, 20b) are formed as tapered surfaces and thus can be illustrated as surfaces in a plan view. However, this is omitted in FIGS. 1, 3 and 4A-4C for clarity of each of the plan views.

Figure 2B:
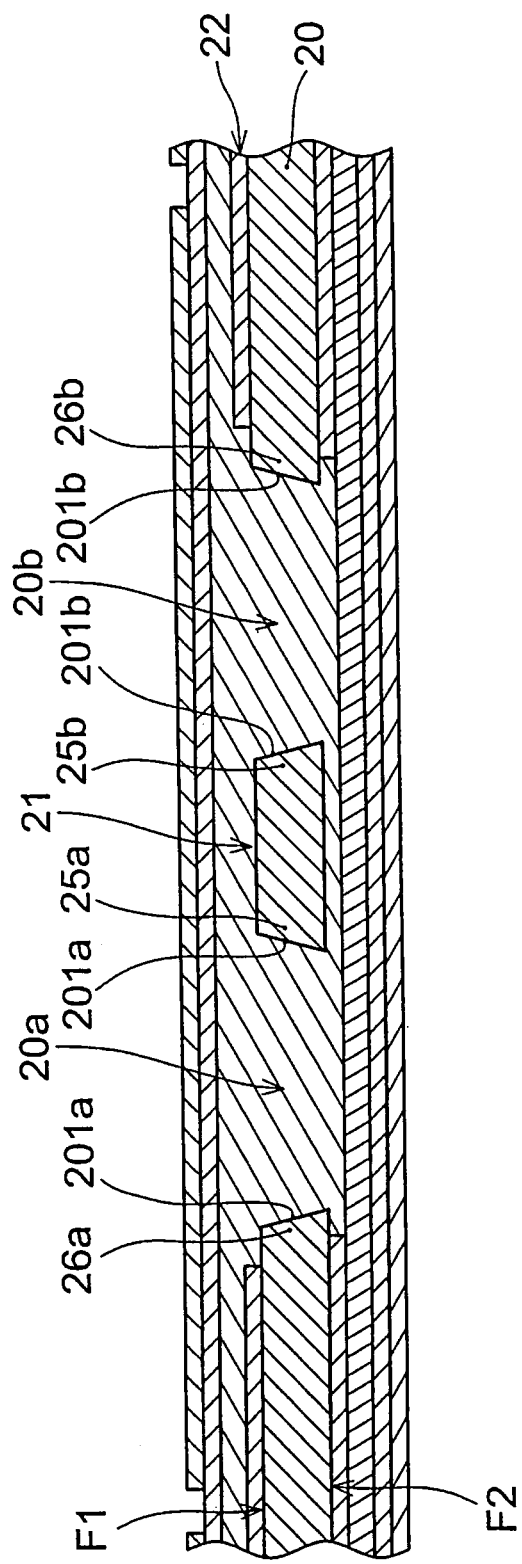
FIG. 2B illustrates a cross-sectional view along a line B-B in FIG. 1.

Further, in the present embodiment, as illustrated in FIGS. 1 and 2B, a projection (25a) is formed that extends from the through hole (20a) side of the partition wall 21 between the two electronic components (23a) in the through hole (20a). Further, a projection (25b) is formed that extends from the through hole (20b) side of the partition wall 21 between the two electronic components (23b) in the through hole (20b). Due to the projection (25a), positional displacements of the two electronic components (23a) in a direction in which they approach each other are suppressed. Similarly, due to the projection (25b), positional displacements of the two electronic components (23b) in a direction in which they approach each other are suppressed. Therefore, in the present embodiment, all positional displacements of the four electronic components that are provided in the one opening (22b) of the first conductor layer 22 in any direction in which they approach each other are suppressed. As a result, short-circuiting between the electrodes of the electronic components (23a) and between the electrodes of the electronic components (23b), and short-circuiting between the electrodes of the electronic components (23a) and the electrodes of the electronic components (23b), are prevented. Further, connection failures in the electrodes 231 of the electronic components (23a, 23b) are reduced. In the present embodiment, as illustrated in FIG. 2B, wall surfaces (201a, 201b) of the projections (25a, 25b) are formed as tapered surfaces and thus can be illustrated as surfaces in a plan view. However, this is omitted in FIGS. 1, 3 and 4A-4C for clarity of each of the plan views.

As illustrated in FIG. 2A, the first conductor layer 22 is provided on a surface (first surface) (F1) on one side of the substrate 20, and the insulating layer 24 is laminated on the first conductor layer 22. In the present embodiment, further, a second conductor layer 31 is formed on the insulating layer 24, and a solder resist 33 is formed on the second conductor layer 31. In the insulating layer 24, a via conductor (27a) that connects the first conductor layer 22 and the second conductor layer 31 and a via conductor (27b) that connects the electrodes 231 of the electronic components (23a, 23b) and the second conductor layer 31 are provided. Similarly, a third conductor layer 41 is provided on a surface (second surface) (F2) that is on an opposite side of the first surface (F1) of the substrate 20. A second insulating layer 42 and a fourth conductor layer 51 are sequentially laminated on the third conductor layer 41. Further, a solder resist 53 is formed on the fourth conductor layer 51. Further, in the second insulating layer 42, a via conductor (43a) that connects the third conductor layer 41 and the fourth conductor layer 51 and a via conductor (43b) that connects the electrodes 231 of the electronic components (23a, 23b) and the fourth conductor layer 51 are provided. The conductor pattern (22a) is provided in the first conductor layer 22. A conductor pattern that forms an electrical circuit, a planer conductor pattern (solid pattern), or a conductor pattern that forms a connecting wire, a pad, a land, or the like, may also be formed in another region of the first conductor layer 22 and also in the second, third and fourth conductor layers (31, 41, 51). Further, a through-hole conductor 28 is provided in the substrate 20. The first conductor layer 22 and the third conductor layer 41 are connected by the through-hole conductor 28.

As illustrated in FIG. 1, in the substrate 20, the opening (22b) is provided where the conductor pattern (22a) is not formed. The opening (22b) is formed by removing a part of the first conductor layer 22 by, for example, etching and the like. In the present embodiment, the opening (22b) is formed in a substantially rectangular shape. However, the shape of the opening (22b) is not limited to this. The opening (22b) may be formed to have any shape and size as long as the through holes (20a, 20b) can be provided in the opening (22b). For example, the opening (22b) may be formed in a substantially circular shape, an elliptical shape, or a shape resulting from combining a circular or elliptical shape and a rectangular shape.

In the present embodiment, as illustrated in FIG. 1, in the one opening (22b), the through holes (20a, 20b) of the substrate 20 are formed. In the present embodiment, the two electronic components (23a) are provided in the through hole (20a), and the two electronic components (23b) are provided in the through hole (20b). In the present embodiment, the through hole (20a) and the through hole (20b) have substantially the same size and are formed in substantially the same planar shape of a rectangle as a whole. In the present embodiment, the through hole (20a) and the through hole (20b) are provided with their positions in a long-side direction aligned and positioned side by side in a short-side direction. The partition wall 21 that is formed from a part of the substrate 20 is provided between the through hole (20a) and the through hole (20b) separating the through hole (20a) and the through hole (20b). A side surface on one side of the partition wall 21 is the inner wall surface (200a) of the through hole (20a) and a side surface on the other side of the partition wall 21 is the inner wall surface (200b) of the through hole (20b).

In the present embodiment, the through holes (20a, 20b) that penetrate the substrate 20 in a thickness direction are formed and the electronic components (23a, 23b) are accommodated in the through holes (20a, 20b). However, spaces for accommodating the electronic components (23a, 23b) are not limited to through holes. For example, it is also possible that multiple recessed portions of predetermined planar shapes and depths are formed in the opening (22b) of the substrate 20. Then, the electronic components (23a, 23b) may be respectively accommodated in the recessed portions. Positioning the electronic components (23a, 23b) in the recessed portions facilitates an positioning process of the electronic components (23a, 23b) in a manufacturing method (to be described later) of the wiring board 10.

In the present embodiment, the conductor pattern (22b) is not provided on the partition wall 21, similar to that on the substrate 20 in the opening (22b). Therefore, a space required for forming the conductor pattern (22b) is reduced and the partition wall 21 can be formed to have a thin width. Therefore, the through hole (20a) and the through hole (20b) can be formed to be close to each other. As a result, a region required for positioning the electronic components (23a, 23b) is reduced. In other words, more electronic components can be positioned in a region of the same size. For example, even when a large number of capacitors that bypass noises of a semiconductor element installed in the wiring board 10 are connected to the semiconductor element, the capacitors can be positioned at a high density. Therefore, more capacitors can be positioned near the semiconductor element. Further, the positioning region of the electronic components is reduced. Therefore, the size of the opening (22b) where the conductor pattern 22 is not formed can be reduced. As a result, a region where the conductor pattern 22 can be formed is increased, and design flexibility of the conductor pattern is increased. The width of the partition wall 21 is not particularly limited. However, it is preferable that the width of the partition wall 21 be as thin as possible as long as a required mechanical strength is obtained. For example, on the surface (the first surface (F1) of the substrate 20), the width is preferably 300 µm or less, and more preferably 200 µm or less.

In the present embodiment, as illustrated in FIG. 1, the projection (25a) is provided in the through hole (20a) on the inner wall surface (200a) on the through hole (20b) side. Further, a projection (26a) is provided on the inner wall surface (200a) on an opposite side of the through hole (20b) side of the through hole (20a). The projection (25a) and the projection (26a) are formed opposing each other at a substantially central part in the long-side direction of the through hole (20a) in a manner respectively projecting toward the inside of the through hole (20a). Similarly, the projection (25b) is provided in the through hole (20b) of the substrate 20 on the inner wall surface (200b) on the through hole (20a) side. Further, a projection (26b) is provided on the inner wall surface (200b) on an opposite side of the through hole (20a) side of the through hole (20b). The projection (25b) and the projection (26b) are formed opposing each other at a substantially central part in the long-side direction of the through hole (20b) in a manner respectively projecting toward the inside of the through hole (20b).

In the present embodiment, as illustrated in FIG. 1, the electronic components (23a) are respectively positioned on one side and the other side of the projections (25a, 26a) in a longitudinal direction of the through hole (20a). Similarly, the electronic components (23b) are respectively positioned on one side and the other side of the projections (25b, 26b) in a longitudinal direction of the through hole (20b). As illustrated in FIG. 1, the projections (25a, 26a) extend in parallel to a longitudinal direction of the electronic components (23a). Further, the projections (25a, 26a) extend between the two electronic components (23a), and front ends of both of the projections (25a, 26a) enter between the two electronic components (23a). Therefore, positional displacements of the electronic components (23a) in a direction in which they approach each other are effectively suppressed. Similarly, the projections (25b, 26b) extend in parallel to a longitudinal direction of the electronic components (23b). Further, the projections (25b, 26b) extend between the two electronic components (23b), and front ends of both of the projections (25b, 26b) enter between the two electronic components (23b). Therefore, positional displacements of the electronic components (23b) in a direction in which they approach each other are effectively suppressed. Further, the projections (25a, 25b, 26a, 26b) are formed such that the front ends thereof enter between the electronic components (23a) or between the electronic components (23b) even when the electronic components (23a, 23b) have made a maximum positional displacement in a direction away from the respective projections. Therefore, positional displacements of the electronic components (23a, 23b) are more reliably suppressed. However, a positional relation between the front ends of the projections (25a, 25b, 26a, 26b) and the electronic components (23a, 23b) is not limited to the one described above.

In the present embodiment, for each of the projections (25a, 25b, 26a, 26b), as illustrated in FIG. 3 in which the projection (25a) is illustrated as a representative, a front end side is formed in a rectangular planar shape, and a base side near the inner wall surface (200a) of the through hole (20a) is formed in a substantially trapezoidal planar shape of which a width increases with decreasing distance from the inner wall surface (200a). Therefore, as illustrated in FIG. 3, a side surface 251 on a side near the inner wall surface (200a) is formed as a surface having a taper. However, the side surface 251 may also be formed as a rounded surface in which a convex portion is formed on an inner side of the projection (25a) in a plan view. The projection (25a) formed in a planar shape having a thin front side and a wide base side facilitates the positioning of the electronic components (23a). Further, a portion of the base side that is formed to be wide enhances a mechanical strength of the projection (25a) of a portion bordering the partition wall 21. However, the planar shape of the projection (25a) is not limited to that illustrated in FIG. 3. For example, it is also possible that the entire projection (25a) is formed in a planar shape of a rectangle, a semicircle, an arch, a trapezoid, or a triangle. Further, it is also possible that a projection such as the projection (25a) is formed as a separate body from the partition wall 21 and thereafter attached to the partition wall 21.

Preferred dimensions of respective parts of the projection (25a) illustrated in FIG. 3 are as follows. A width (W1) of a boundary portion between the projection (25a) and the partition wall 21 is preferably about 60-100 µm. A width (W2) of a portion having a rectangular planar shape of the front end side of the projection (25a) is preferably about 20 µm. A protrusion amount (L1) of the projection (25a) is preferably about 125 µm, of which a length (L2) of the portion having the rectangular planar shape of the front end side is preferably about 85 µm. However, the dimensions of the respective parts of the projection (25a) are not limited to these. Further, preferred dimensions of respective parts of each of the projections other than the projection (25a) are the same as those of the projection (25a). However, each of the projections may have different dimensions. Further, in the present embodiment, clearances between the electronic components (23a, 23b) and the inner wall surfaces (200a, 200b) of the through holes (20a, 20b) are preferably about 80 µm.

In the present embodiment, as illustrated in FIGS. 2A and 2B, the inner wall surface (200a) of the through hole (20a), the inner wall surface (200b) of the through hole (20b), the wall surfaces (201a) of the projections (25a, 26a) and the wall surfaces (201b) of the projections (25b, 26b), of the substrate 20, are all formed as tapered surfaces in which the first surface (F1) side of the substrate 20 is inclined toward an outer side of each of the through holes (20a, 20b). Therefore, even when the electronic components (23a, 23b) are positioned slightly displaced from normal positions, due to the tapers of the respective wall surfaces, the positions of the electronic components (23a, 23b) can be naturally corrected. Further, the through holes (20a, 20b) each have a larger opening on the first surface (F1) side than on the second surface (F2) side. Therefore, the electronic components (23a, 23b) can be easily placed in the through holes (20a, 20b) from the first surface (F1) side.

In the present embodiment, the through hole (20a) and the through hole (20b) are provided. However, as illustrated in FIG. 4A, it is also possible that, in the one opening (22b) of the first conductor layer 22, a through hole (20c) is further provided, and, similar to that between the through hole (20a) and the through hole (20b), a partition wall 21 is provided between the through hole (20c) and the through hole (20b) to separate the two. Further, projections (25c, 26c) may be provided in the through hole (20c).

Figure 4B:
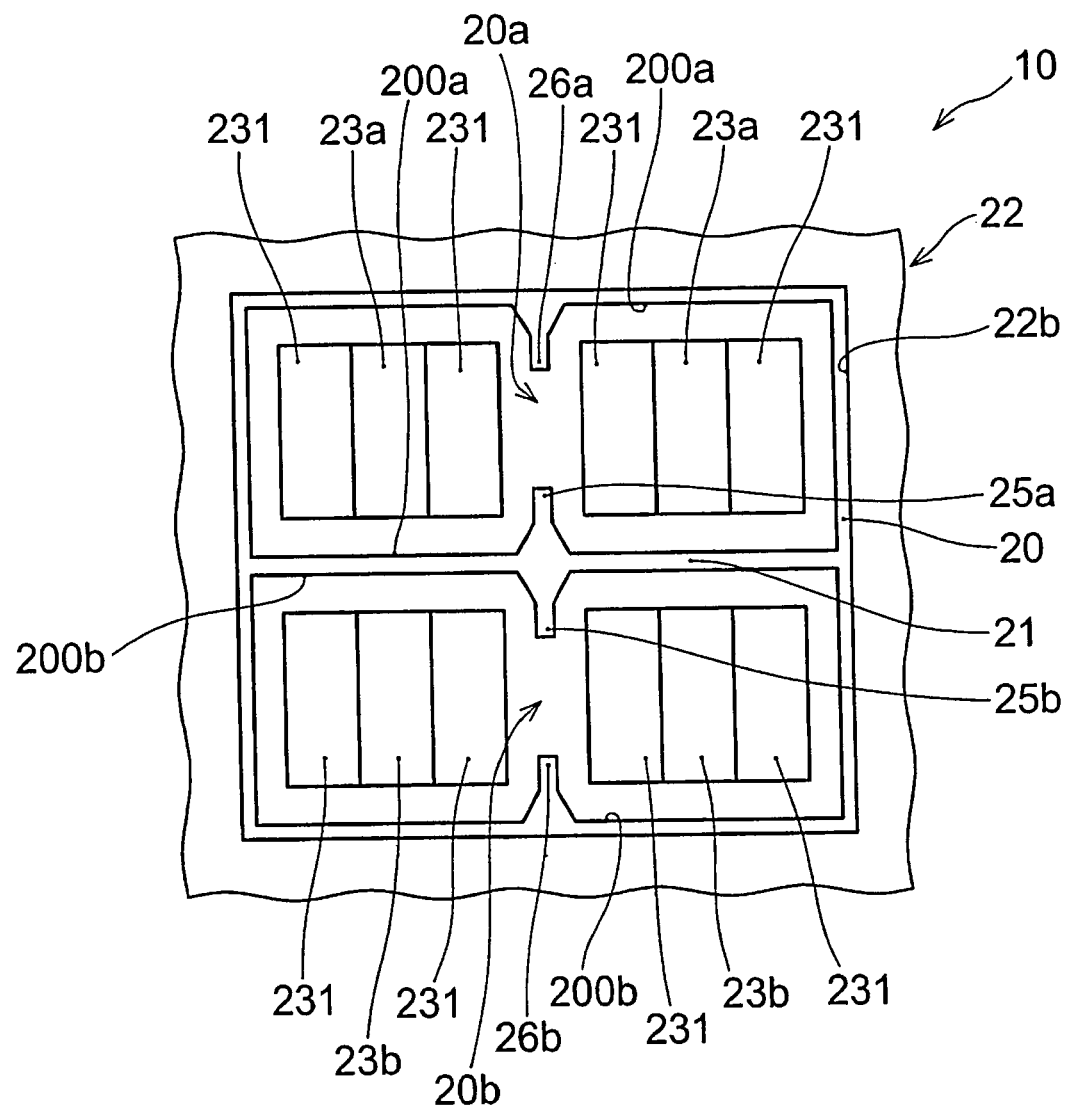
FIG. 4B illustrates a plan view of another modified embodiment of the multilayer wiring board (illustrated in FIG. 1) with a built-in electronic component.

In the present embodiment, in the through holes (20a, 20b), the two electronic components (23a) and the two electronic components (23b), each of which has the electrode 231 on each of two end parts thereof in a longitudinal direction, are respectively positioned side by side in a direction orthogonal to an arrangement direction of the two electrodes 231. Further, the through hole (20a) and the through hole (20b) are provided side by side in a direction parallel to the arrangement direction of the two electrodes 231. However, the positions of the electronic components (23a, 23b) and the through holes (20a, 20b) are not limited to the above-described positions. For example, as illustrated in FIG. 4B, it is also possible that the two electronic components (23a) and the two electronic components (23b) are respectively positioned in the through hole (20a) and the through hole (20b) side by side in a direction parallel to the arrangement direction of the two electrodes 231. Then, the through hole (20a) and the through hole (20b) may be provided side by side and separated by the partition wall 21 in a direction orthogonal to the arrangement direction of the two electrodes 231. Also in the example illustrated in FIG. 4B, the projections (25a, 25b, 26a, 26b) are provided on the inner wall surfaces (200a, 200b) of the through holes (20a, 20b). The projections (25a, 26a) extend in parallel to a lateral direction of the electronic components (23a). Further, the projections (25a, 26a) extend between the two electronic components (23a), and front ends of both of the projections (25a, 26a) enter between the two electronic components (23a). Similarly, the projections (25b, 26b) extend in parallel to a lateral direction of the electronic components (23b). Further, the projections (25b, 26b) extend between the two electronic components (23b), and front ends of both of the projections (25b, 26b) enter between the two electronic components (23b).

Figure 4C:
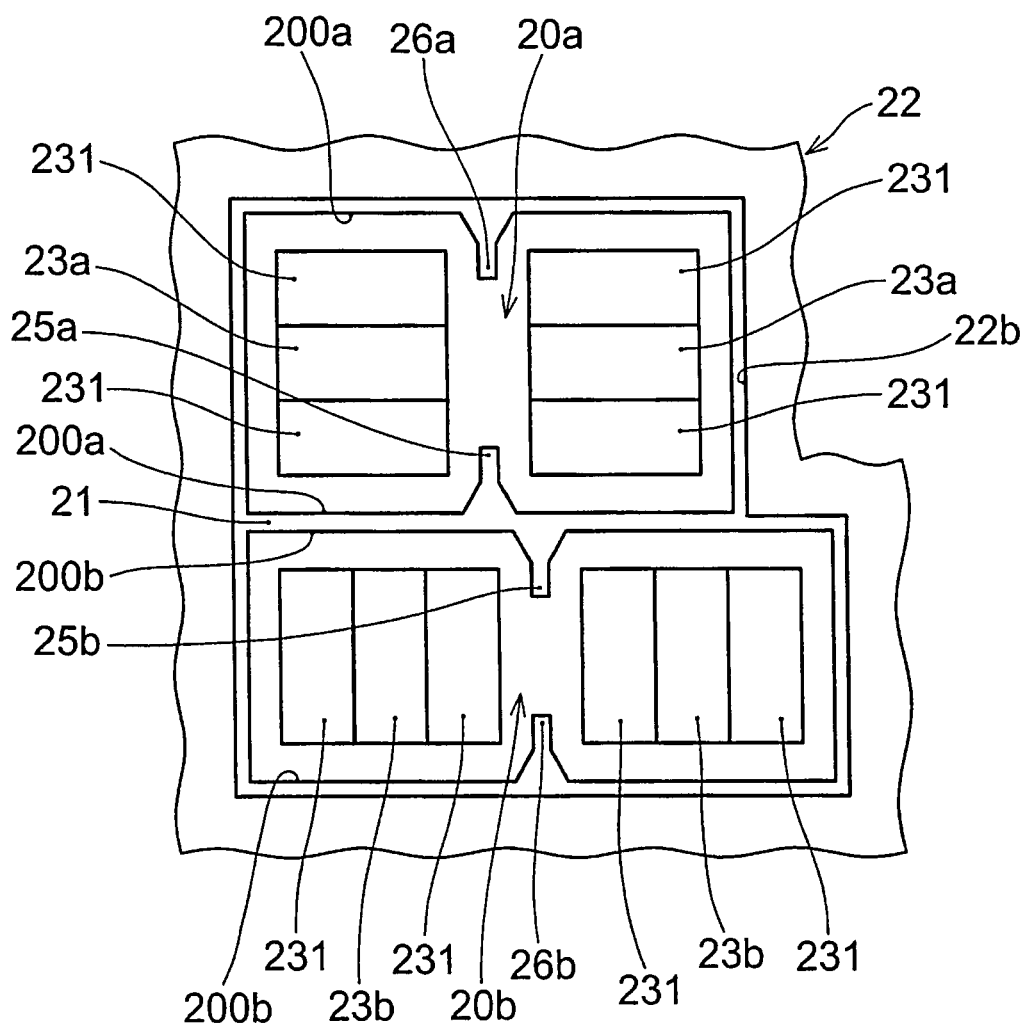
FIG. 4C illustrates a plan view of yet another modified embodiment of the multilayer wiring board (illustrated in FIG. 1) with a built-in electronic component.

Further, the through holes (20a, 20b), the projections (25a, 25b, 26a, 26b) and the electronic components (23a, 23b) of the wiring board 10 of the present embodiment may also be provided in a positioning as illustrated in FIG. 4C. That is, in the one opening (22b) of the first conductor layer 22, the through hole (20a) and the through hole (20b), which are separated by the partition wall 21, are formed. In the through hole (20a), the electronic components (23a) are positioned in an orientation in which the arrangement direction the two electrodes 231 is orthogonal to a length direction of the partition wall 21. Further, in the through hole (20b), the two electronic components (23b) are respectively positioned in an orientation in which the arrangement direction the two electrodes 231 is parallel to the length direction of the partition wall 21. As just described, it is also possible that the orientations of the electronic components (23a) and the electronic components (23b), which are respectively positioned in the through hole (20a) and the through hole (20b) that are formed in the one opening (22b), are different from each other. Then, on the inner wall surface (200a) of the through hole (20a), which is also a side surface on one side of the partition wall 21, the projection (25a) is formed. On the inner wall surface (200a) of the through hole (20a) on a side opposing the partition wall 21, the projection (26a) is formed. Similarly, on the inner wall surface (200b) of the through hole (20b), which is also a side surface on the other side of the partition wall 21, the projection (25b) is formed. On the inner wall surface (200b) of the through hole (20b) on a side opposing the partition wall 21, the projection (26b) is formed. The projections (25a, 26a) extend in parallel to the longitudinal direction of the electronic components (23a). On the other hand, the projections (25b, 26b) extend in parallel to the lateral direction of the electronic components (23b). Then, the projections (25a, 26a) extend between the two electronic components (23a), and the front ends of both of the projections (25a, 26a) enter between the two electronic components (23a). Further, the projections (25b, 26b) also extend between the two electronic components (23b), and the front ends of both of the projections (25b, 26b) enter between the two electronic components (23b).

Figure 4D:
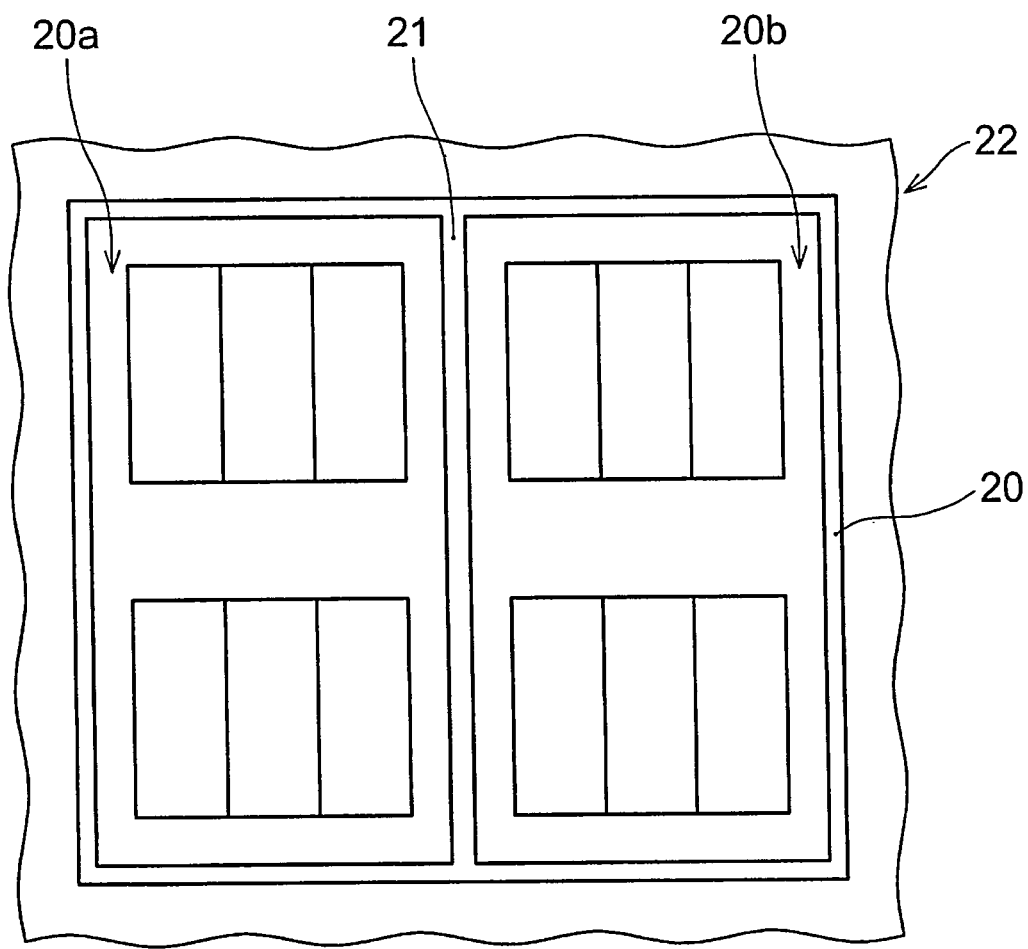
FIG. 4D illustrates a plan view of a modified embodiment in which a projection is not provided in the multilayer wiring board (illustrated in FIG. 1) with a built-in electronic component.

Further, in the present embodiment, the through hole (20a) and the through hole (20b), which are provided in the one opening (22b) of the first conductor layer 22, are formed to have substantially the same shape and substantially the same size. However, without being limited to this, the through hole (20a) and the through hole (20b) may also be formed to have mutually different sizes. Further, the through hole (20a) and the through hole (20b) may also be formed to have mutually different shapes. The planar shape of the through holes (20a, 20b) is not limited to a rectangular shape. For example, the through holes (20a, 20b) may also be formed in a shape of an ellipse, a circle, a polygon, or the like. Further, in the present embodiment, the projections (25a, 26a) are provided on the inner wall surface (200a) of the through hole (20a), and the projections (25b, 26b) are provided on the inner wall surface (200b) of the through hole (20b). However, it is also possible that only one of the projections (25a, 26a) and the projections (25b, 26b) is formed. Alternatively, as illustrated in FIG. 4D, it is also possible that all of the projections are not provided. Further, in the present embodiment, two electronic components are provided in one through hole. However, without being limited to this, it is also possible that, in one through hole, only one electronic component is provided, or three or more electronic components are provided. In such case, projections may be provided on the inner wall surface of the through hole such that front ends of the projections respectively enter between the three or more electronic components that are provided.

In the present embodiment, the substrate 20 is formed using an insulating material and forms a core substrate of the wiring board 10. The substrate 20 is formed using a material (hereinafter, referred to as a glass epoxy) that is formed by impregnating a core material such as a glass cloth with an epoxy resin. However, the substrate 20 may also be formed using any material other than the glass epoxy.

The insulating layer 24 is formed on the first surface (F1) of the substrate 20 and on the electronic components (23a, 23b). In the present embodiment, as will be described later, a material that forms the insulating layer 24 also flows into between the electronic components (23a) and the electronic components (23b) and between the electronic components (23a, 23b) and the inner wall surfaces (200a, 200b) of the through holes (20a, 20b) when the insulating layer 24 is formed. Therefore, the insulating layer 24 is also formed in these regions. Further, the second insulating layer 42 is formed on the second surface (F2) of the substrate 20 and on the electronic components (23a, 23b) on the second surface (F2) side of the substrate 20. In the present embodiment, surroundings of the electronic components (23a, 23b) are completely covered by the insulating layer 24 and the second insulating layer 42. As a result, the electronic components (23a, 23b) are protected and are fixed at predetermined positions in the through holes (20a, 20b). In the present embodiment, the insulating layer 24 and the second insulating layer 42 are formed using an epoxy resin that contains inorganic filler and that does not contain a glass cloth. However, the material of the insulating layer 24 and the second insulating layer 42 is not limited to this. For example, other than the epoxy resin, a bismaleimide triazine resin (BT resin), an imide resin (polyimide), and the like, can be used. Further, the material of the insulating layer 24 and the second insulating layer 42 may also contain a core material such as a glass cloth, and the above-described glass epoxy and the like may also be used.

In the present embodiment, the electronic components (23a, 23b) are respectively chip type capacitors. As illustrated in FIG. 1, each of the electronic components (23a, 23b) is formed in a substantially rectangular planar shape and has the electrode 231 on each of the two end parts thereof in the longitudinal direction. The electronic components (23a, 23b) are not limited to capacitors as in the present embodiment, but any other electronic components may also be used. For example, the electronic components (23a, 23b) may also be chip type inductors, resistors or semiconductor devices in a bare chip state. Further, the electronic components (23a) and the electronic components (23b) may be different kinds of electronic components. Further, multiple electronic components provided in one through hole may be different kinds of electronic components.

The via conductors (27a, 27b, 43a, 43b) and through-hole conductor 28 are preferably formed by plating and, for example, may each contain any one or both of an electroless plating film and an electrolytic plating film. Materials for the respective via conductors and the through-hole conductor are not particularly limited. However, copper is preferably used. The via conductors (27a, 27b, 43a, 43b) and the through-hole conductor 28 may each be a filled conductor or a conformal conductor.

In the present embodiment, the first conductor layer 22 and the third conductor layer 41 are formed by a copper foil and an electroless plating film and an electrolytic plating film that are formed on a copper foil. Further, the second conductor layer 31 and the fourth conductor layer 51 are formed from an electroless plating film and an electrolytic plating film. However, the structures of the respective conductor layers are not limited to these. For example, it is also possible that a copper foil or an electrolytic plating film is not contained. Further, copper is preferably used as a material for each of the conductor layers. However, other conductive materials may also be used as materials of the respective conductor layers.

Figure 6A:
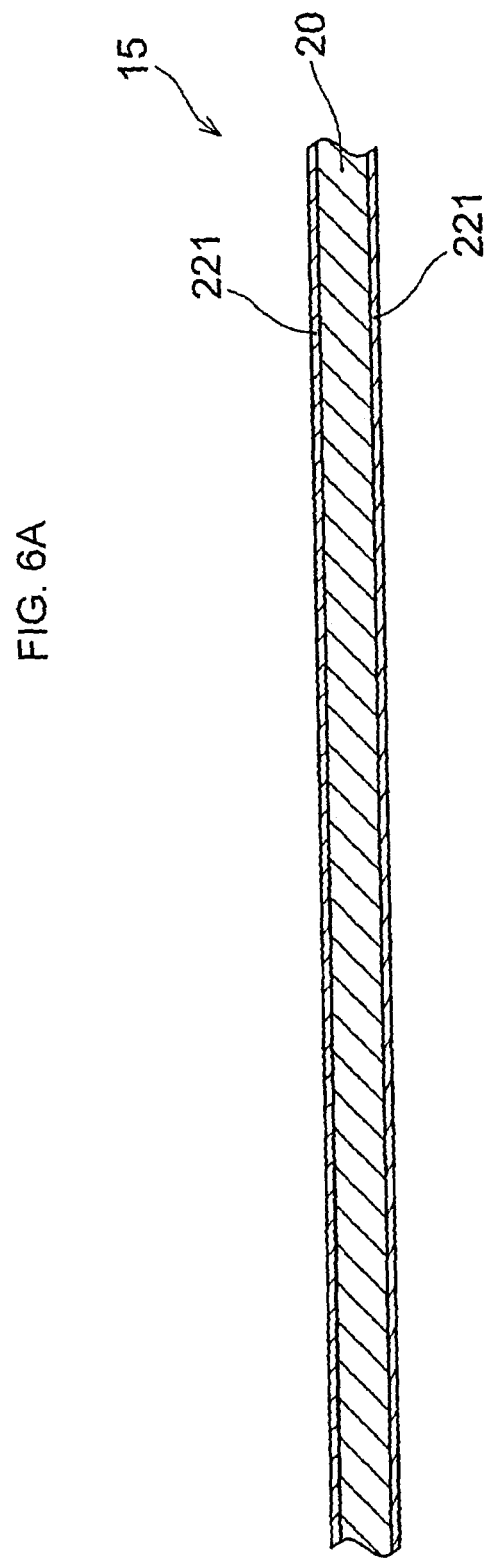
FIG. 6A illustrates an explanatory diagram of respective processes of the manufacturing method of the multilayer wiring board (illustrated in FIG. 1) with a built-in electronic component.

A manufacturing method of the wiring board 10 of the embodiment illustrated in FIG. 1 is described with reference to FIGS. 5 and 6A-6K. First, at a step indicated by S11 in FIG. 5, the through-hole conductor 28 is formed in the substrate 20. Specifically, as illustrated in FIG. 6A, as a starting material, a double-sided copper-clad laminated plate 15 is prepared that is obtained by providing a copper foil 221 on both sides of the substrate 20. In the present embodiment, the substrate 20 is formed from the glass epoxy in a fully cured state.

As illustrated in FIG. 6B, for example, $CO_2$ laser is used to irradiate laser light onto a same position of the double-sided copper-clad laminated plate 15 from both the first surface (F1) side and the second surface (F2) side of the substrate 20. As a result, a through hole 281 is formed. After the formation of the through hole 281, preferably, desmear can be performed with respect to the through hole 281. Further, in order to improve laser absorption efficiency, a surface of the copper foil 221 may be subjected to a blackening treatment before laser irradiation. Further, the through hole 281 may also be formed using a method other than laser processing, such as using a drill or etching. However, since it facilitates fine processing, laser processing is preferably used.

For example, a copper plating film 222 is formed on the copper foil 221 and in the through hole 281 by using, for example, a panel plating method. Specifically, first, electroless plating is performed. Next, electrolytic plating is performed using the electroless plating film as a seed layer. Thereby, the plating film 222, which is formed from the electroless plating film and the electrolytic plating film, is formed. As a result, the through hole 281 is filled with copper of the plating film 222 and the through-hole conductor 28 is formed. Further, the first conductor layer 22 and the third conductor layer 41, which are formed from the copper foil 221 and the plating film 222, are formed.

At a step indicated by S12 in FIG. 5, the first conductor layer 22 and the third conductor layer 41 are patterned. Specifically, the plating film 222 on the first surface (F1) side of the substrate 20 is covered by an etching resist having a pattern corresponding to the conductor pattern that is formed in the first conductor layer 22. The plating film 222 on the second surface (F2) side is also similarly covered by an etching resist having a pattern corresponding to the conductor pattern that is formed in the third conductor layer 41. Then, portions of the plating film 222 and the copper foil 221 that are not covered by the etching resists (portions exposed from openings of the etching resists) are removed. As a result, as illustrated in FIG. 6C, the first conductor layer 22 and the third conductor layer 41 having their predetermined regions removed are respectively formed on the first surface (F1) and the second surface (F2) of the substrate 20. The first conductor layer 22 and the third conductor layer 41 are each illustrated as only one layer in each of the drawings. However, in the present embodiment, specifically, the first conductor layer 22 and the third conductor layer 41 are each formed from three layers including, for example, a copper foil layer (lower layer), an electroless copper plating layer (middle layer) and an electrolytic copper plating layer (upper layer).

Figure 6D:
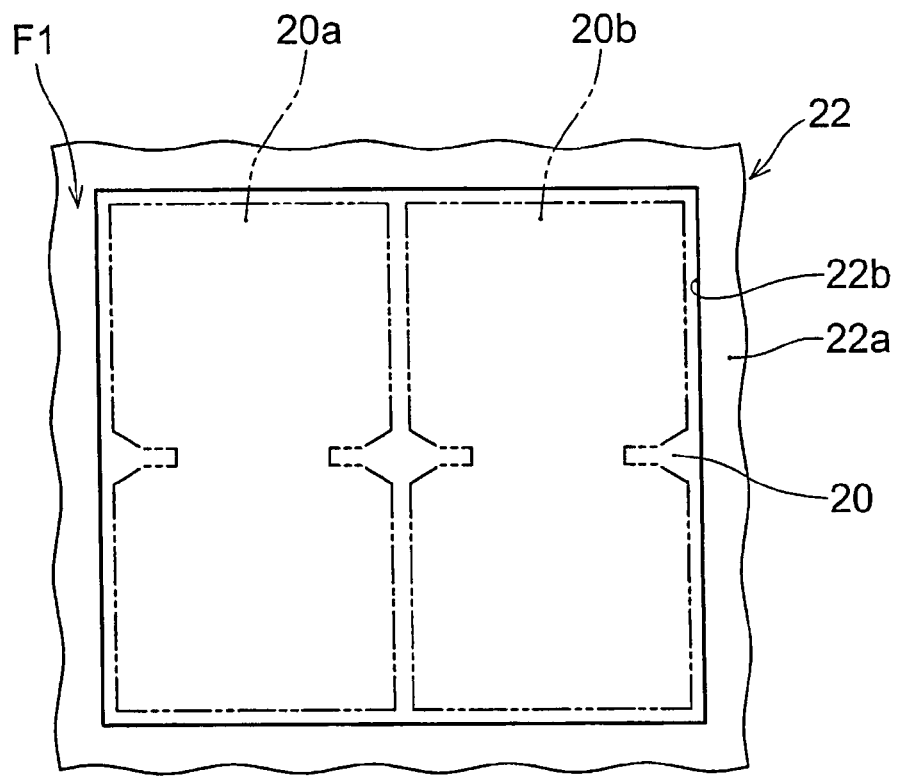
FIG. 6D illustrates an explanatory diagram of respective processes of the manufacturing method of the multilayer wiring board (illustrated in FIG. 1) with a built-in electronic component.

In the present embodiment, in the patterning process illustrated in FIG. 6C, as illustrated in FIG. 6D, in regions where the through holes (20a, 20b) are formed and in their surrounding regions, the first conductor layer 22 is removed in a process to be described later. As a result, on the first surface (F1) of the substrate 20, the opening (22b) is formed where the conductor pattern (22a) is not provided. In the present embodiment, as illustrated in FIG. 6C, also on the second surface (F2) of the substrate 20, an opening (22c) is similarly formed where a conductor pattern is not provided.

Figure 6E:
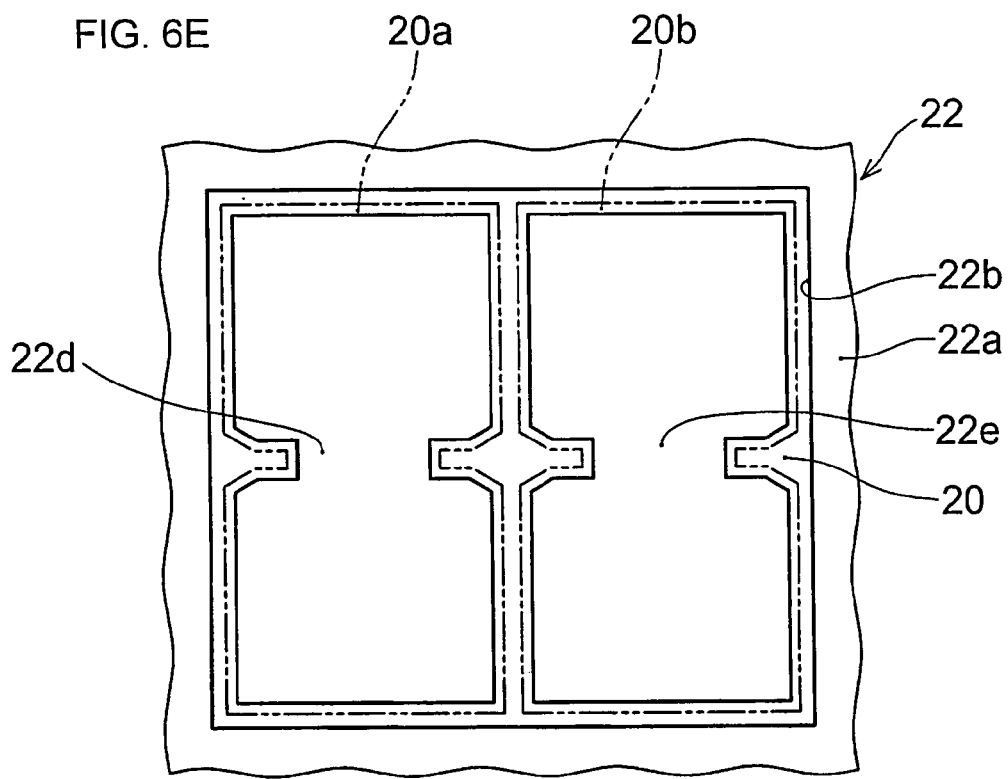
FIG. 6E illustrates an explanatory diagram of respective processes of the manufacturing method of the multilayer wiring board (illustrated in FIG. 1) with a built-in electronic component.

In the example illustrated in FIG. 6D, the first conductor layer 22 is removed later over the entire surface of the regions where the through holes (20a, 20b) are formed and their surrounding regions. However, the method to remove the first conductor layer 22 is not limited to such a method. For example, as illustrated in FIG. 6E, it is also possible that the first conductor layer in the regions where the through holes (20a, 20b) are provided is left unremoved. In the example illustrated in FIG. 6E, the portions of the first conductor layer 22 in regions (22d, 22e) that have shapes substantially the same as those of the through holes (20a, 20b) but are slightly smaller than the through holes (20a, 20b) are kept, and the first conductor layer 22 in surrounding regions of the regions (22d, 22e) is removed. Outer peripheries of the regions (22d, 22e) are along contours of the through holes (20a, 20b). By leaving the first conductor layer 22 unremoved in regions where the through holes (20a, 20b) are formed as described above, for example, when the through holes (20a, 20b) are formed by laser light irradiation (to be described later), adjustment of an irradiation position of laser light becomes easy. Further, warpage or the like of the substrate is less likely to occur. The region of the first conductor layer 22 that is left unremoved can be removed together with a part of the substrate 20 that is taken away when the through holes (20a, 20b) are formed.

Figure 6F:
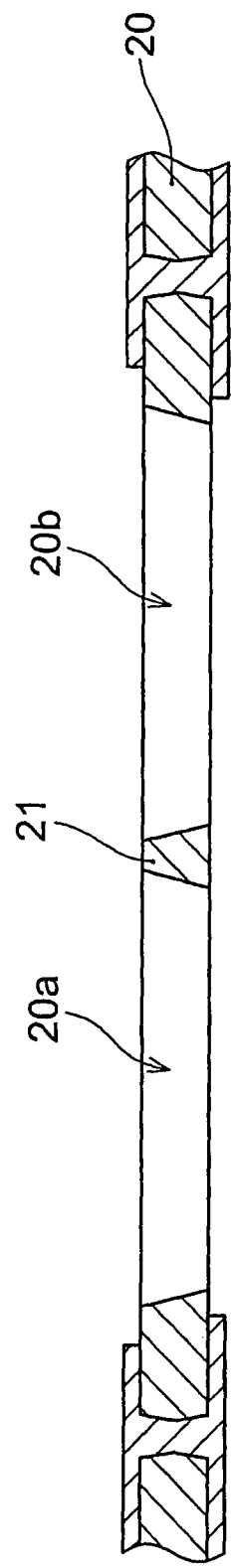
FIG. 6F illustrates an explanatory diagram of respective processes of the manufacturing method of the multilayer wiring board (illustrated in FIG. 1) with a built-in electronic component.
Figure 6I:
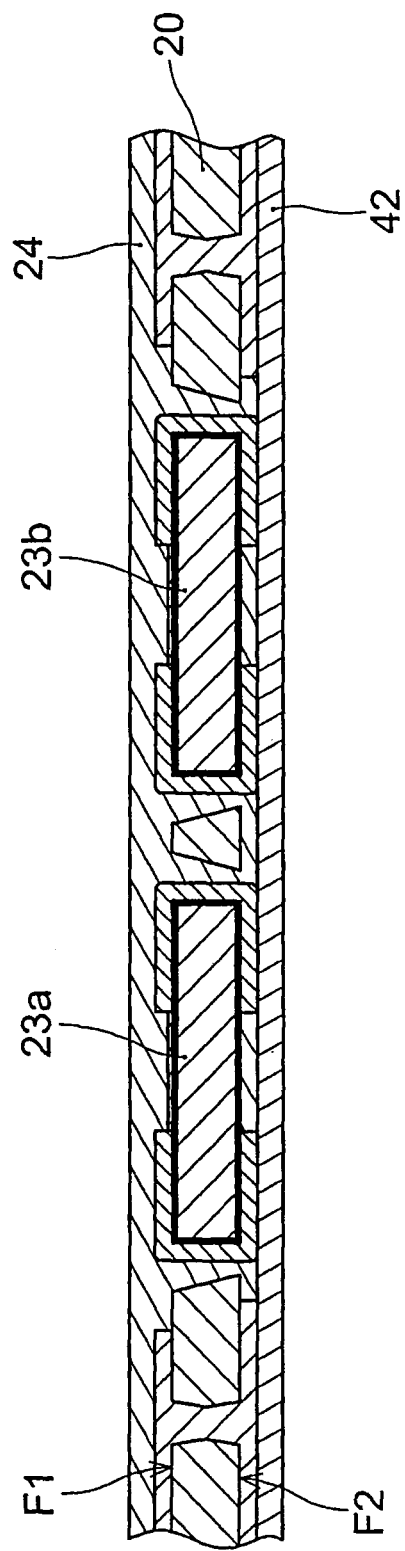
FIG. 6I illustrates an explanatory diagram of respective processes of the manufacturing method of the multilayer wiring board (illustrated in FIG. 1) with a built-in electronic component.

The regions of the substrate 20 where the through holes (20a, 20b) are formed are cut off. Specifically, for example, along the contours of the through holes (20a, 20b) illustrated by two-dot chain lines in FIGS. 6D and 6E, laser light is irradiated to the substrate 20 from the first surface (F1) side, and regions corresponding to the through holes (20a, 20b) are cut out from the substrate 20. As a result, as illustrated in FIG. 6F, the through holes (20a, 20b) are formed in the substrate 20. Further, between the through holes (20a, 20b), the partition wall 21 is formed. Further, in the through holes (20a, 20b), the projections (25a, 26a) (see FIG. 1) and the projections (25b, 26b) (see FIG. 1) are respectively formed. In the present embodiment, the through holes (20a, 20b) are formed using laser light. However, without being limited to this, the through holes (20a, 20b) may also be formed using a mode and the like. As described above, in the case where the recessed portions are formed in place of the through holes (20a, 20b), regions of predetermined planar shapes and depths on a part of the substrate 20 are removed, for example, from the first surface (F1) side of the substrate 20 by drill grinding, laser irradiation, or the like. As a result, for example, two recessed portions are formed and a partition wall separating the two recessed portions is formed. Further, at the same time, projections can be respectively formed on inner wall surfaces of the respective recessed portions.

At a step indicated by S13 in FIG. 5, the electronic components (23a, 23b) are positioned in the through holes (20a, 20b) of the substrate 20. Specifically, for example, a carrier 61 that is formed from PET (polyethylene terephthalate) is provided on one side (for example, the second surface (F2) side) of the substrate 20. As a result, as illustrated in FIG. 6G, openings of the through holes (20a, 20b) on one side are closed by the carrier 61. In the present embodiment, the carrier 61 is formed from an adhesive sheet (for example, a tape) having adhesiveness on one side and, for example, the side with adhesiveness is bonded to the substrate 20. As described, in the case where the recessed portions are formed in place of the through holes (20a, 20b), bonding of the carrier 61 and a removal process (to be described later) of the carrier 61 are not required and the manufacturing process of the wiring board 10 can be simplified.

As illustrated in FIG. 6G, the electronic components (23a, 23b) are positioned in the through holes (20a, 20b), for example, using a component mounter. For example, the electronic components (23a, 23b) are each picked up by a nozzle (not illustrated in the drawings) or the like of the component mounter and placed on the carrier 61 in the through holes (20a, 20b). As described above, in the case where the recessed portions are formed in place of the through holes (20a, 20b), the electronic components (23a, 23b) are positioned in the recessed portions.

At a step indicated by S14 in FIG. 5, on the side where the through holes (20a, 20b) or the recessed portions are open, the insulating layer 24 in a semi-cured state is formed. Specifically, the insulating layer 24 in a semi-cured state is positioned on the first surface (F1) the substrate 20 illustrated in FIG. 6H and on the electronic components (23a, 23b). Next, the insulating layer 24 in the semi-cured state is pressed in the thickness direction of the substrate 20 as illustrated by arrows in FIG. 6H. Resin flowed out from the insulating layer 24 flows into the through holes (20a, 20b) or the recessed portions. As a result, as illustrated in FIG. 6H, regions between the electronic components (23a, 23b) and the substrate 20 in the through holes (20a, 20b) or in the recessed portions are respectively filled by resin flowed out from the insulating layer 24, and the insulating layer 24 is also formed in these regions.

The insulating layer 24 and the electronic components (23a, 23b) in the through holes (20a, 20b) or in the recessed portions are temporarily welded to each other. Specifically, by being heated, the resin that forms the insulating layer 24 develops adhesiveness of an extent enough to support the electronic components (23a, 23b). As a result, the electronic components (23a, 23b) that have been supported by the carrier 61 are supported by the insulating layer 24. Thereafter, the carrier 61 is removed. At this stage, the insulating layer 24 is only semi-cured, not fully cured. However, without being limited to this, at this point, the insulating layer 24 may also be fully cured.

At a step indicated by S15 in FIG. 5, on the second surface (F2) side of the substrate 20, the second insulating layer 42 is formed and is fully cured together with the insulating layer 24. Specifically, on the second surface (F2) of the substrate 20, the second insulating layer 42 in a semi-cured state is provided so as to cover the electronic components (23a, 23b) and is bonded to the substrate 20 by, for example, pressing. Thereafter, the insulating layer 24 and the second insulating layer 42 are heated and are respectively fully cured. As a result, the fully cured insulating layer 24 and second insulating layer 42 are respectively formed in the surroundings and on upper layer sides of the electronic components (23a, 23b) and on upper layer sides of the substrate 20 (see FIG. 6I).

At a step indicated by S16 in FIG. 5, the via conductors and the second conductor layer are formed. Specifically, as illustrated in FIG. 6J, for example, by using laser, via holes 271 are formed in the insulating layer 24, and via holes 431 are formed in the second insulating layer 42. The via holes 271 penetrate through the insulating layer 24, and the via holes 431 penetrate through the second insulating layer 42. Thereafter, preferably, desmear is performed.

Figure 6K:
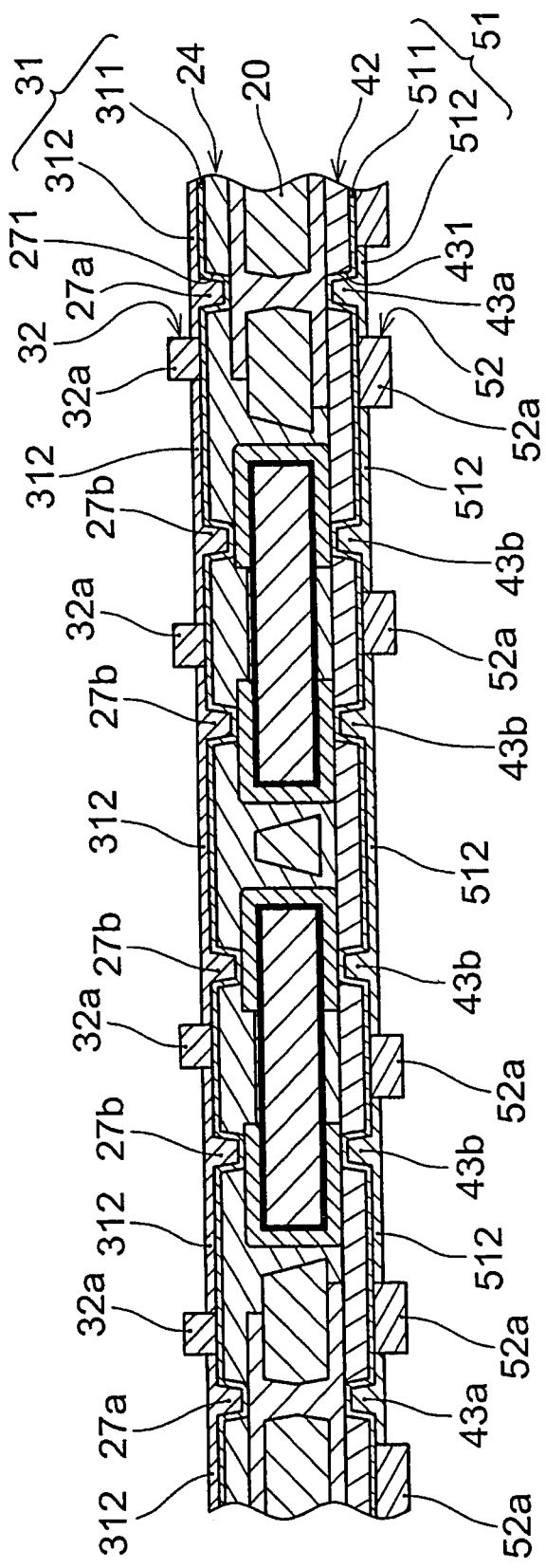
FIG. 6K illustrates an explanatory diagram of respective processes of the manufacturing method of the multilayer wiring board (illustrated in FIG. 1) with a built-in electronic component.

For example, by chemical plating, as illustrated in FIG. 6K, for example, copper electroless plating films (311, 511) are formed on the insulating layer 24, on the second insulating layer 42, in the via holes 271 and in the via holes 431. Prior to the electroless plating, for example, by immersion, a catalyst containing palladium and the like may be adsorbed on surfaces of the insulating layer 24 and the second insulating layer 42. The electroless plating films (311, 511) function as seed layers of electrolytic plating films (312, 512) to be described later. However, the seed layers of the electrolytic plating films (312, 512) are not limited to electroless plating films. For example, sputtered films and the like may also be used as the seed layers.

By lithography, printing or the like, as illustrated in FIG. 6K, a plating resist 32 is formed such that a mask part (32a) is formed in a region where the second conductor layer 31 is not formed on the electroless plating film 311. Similarly, a plating resist 52 is formed such that a mask part (52a) is formed in a region where the fourth conductor layer 51 is not formed on the electroless plating film 511.

For example, by using a pattern plating method, as illustrated in FIG. 6K, for example, the copper electrolytic plating films (312, 512) are formed on the electroless plating films (311, 511). As a result, the second conductor layer 31, which is formed from the electroless plating film 311 and the electrolytic plating film 312, and the fourth conductor layer 51, which is formed from the electroless plating film 511 and the electrolytic plating film 512, are formed. Further, along with this, the via holes 271 are filled with the electrolytic plating film 312 and the via holes 431 are filled with the electrolytic plating film 512. As a result, the via conductors (27a, 27b, 43a, 43b), which are formed from, for example, copper plating, are formed.

Thereafter, for example, by using a predetermined peeling solution, the plating resists (32, 52) are removed. Next, by removing portions of the electroless plating films (311, 511) on which the plating resists (32, 52) are not formed, as illustrated in FIG. 6L, the second conductor layer 31 and the fourth conductor layer 51 are patterned into predetermined patterns.

Figure 6L:
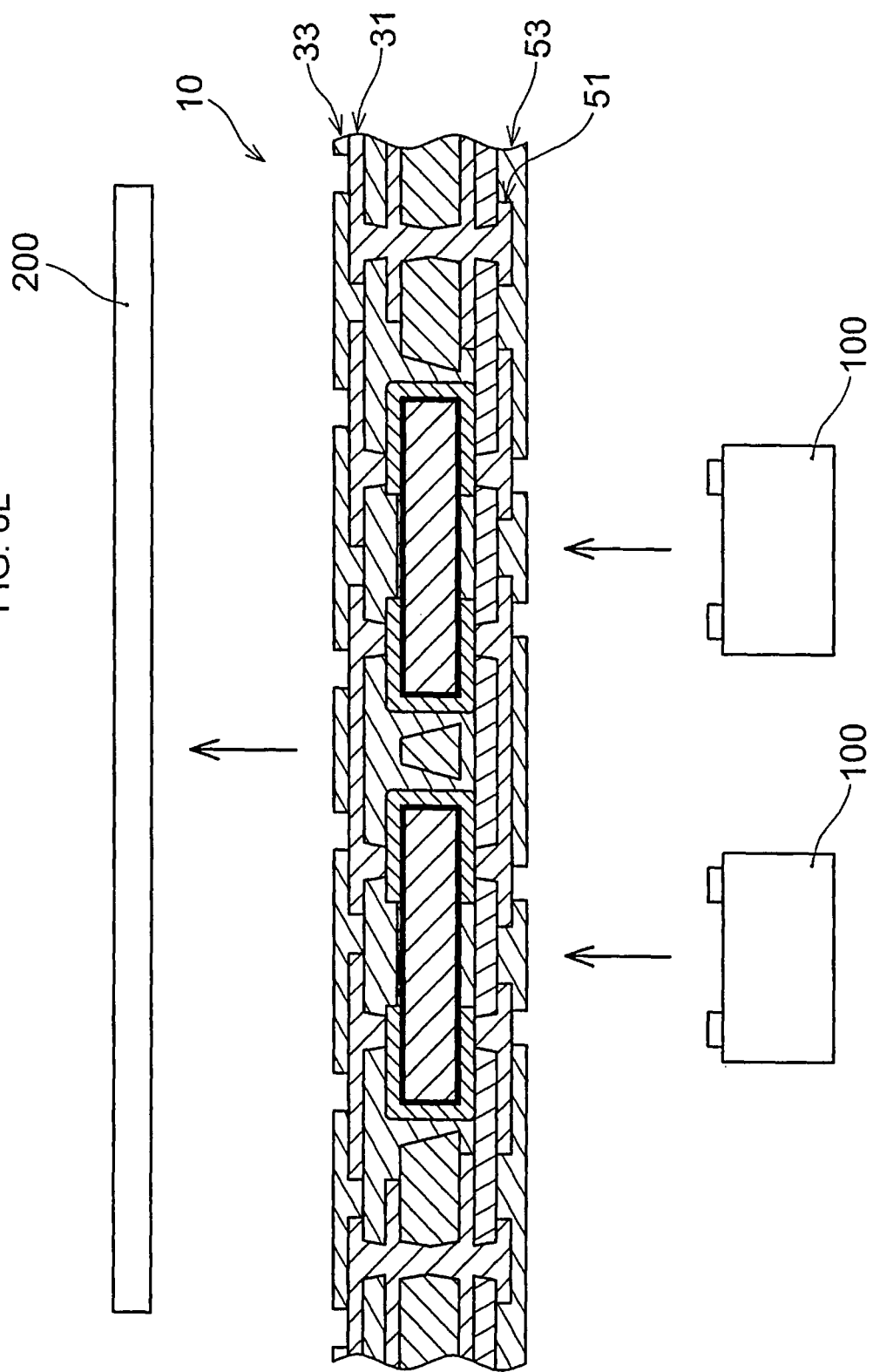
FIG. 6L illustrates an explanatory diagram of respective processes of the manufacturing method of the multilayer wiring board (illustrated in FIG. 1) with a built-in electronic component.

In the wiring board 10 of the present embodiment, after the patterning of the second conductor layer 31 and the fourth conductor layer 51, at a step indicated by S17 in FIG. 5, as illustrated in FIG. 6L, the solder resists (33, 53) may be formed. Further, a corrosion-resistant layer (not illustrated in the drawings) that is formed, for example, from a Ni/Au film, may be formed by electrolytic plating, sputtering, or the like, on the second conductor layer 31 and the fourth conductor layer 51 that are not covered by the solder resists (33, 53). Further, a corrosion-resistant layer that is formed from an organic protective film may be formed by immersion in a liquid protective material, spraying a protective material, or the like. As a result, the wiring board 10 of the present embodiment illustrated in FIGS. 1 and 6L is completed.

For example, as illustrated in FIG. 6L, an external electronic component 100 (for example, an IC chip) may be mounted on the wiring board 10 of the present embodiment. Further, the wiring board 10 may be mounted on another wiring board 200 (for example, a motherboard).

In the present embodiment, the conductor layers and the insulating layers are formed on both sides of the substrate 20 of the wiring board 10. However, without being limited to this, the wiring board 10 may also be a single-sided wiring board in which, for example, an insulating layer and a wiring layer may be formed only on one side of the substrate 20. Further, one pair or more pairs of conductor layers and insulating layers may be further formed on the second conductor layer 31 and/or on the fourth conductor layer 51.

Further, the manufacturing method of the wiring board 10 of the present embodiment is not limited to the method described with reference to FIGS. 5 and 6A-6L. The conditions, processing order and the like of the method may be arbitrarily modified. Further, certain steps may be omitted and other steps may be added.

In a manufacturing process, electronic components are placed at predetermined positions in through hole and, thereafter, insulating resin is supplied to surroundings of the electronic components. The electronic components are fixed at the positions as the resin cures. However, the resin is flowable before the resin cures. Therefore, the electronic components may be displaced from normal positions due to flow of the resin. When the electronic components are displaced, connection failure between the electronic components and the via conductor may occur and short-circuiting may occur between the electrodes of the electronic components.

A multilayer wiring board with the built-in electronic component according to an embodiment of the present invention suppresses positional displacement of electronic components. A multilayer wiring board with the built-in electronic component according to an embodiment of the present invention reduces a region required for positioning the electronic components.

A multilayer wiring board with built-in electronic components according to an embodiment of the present invention includes: a substrate that is formed from an insulating material; a first conductor layer that is formed on a surface of the substrate; multiple recessed portions or through holes that are formed in the substrate; electronic components that are positioned in the recessed portions or in the through holes of the substrate; and an insulating layer that is formed on the electronic components, on the substrate and on the first conductor layer. At least two recessed portions or through holes are formed, using the substrate as a partition wall, in one opening of the first conductor layer where a conductor pattern is not provided.

According to an embodiment of the present invention, even when multiple electronic components are built in, positional displacement of each of the electronic components is reduced. As a result, occurrence of connection failure between the electronic components and a via conductor and occurrence of short-circuiting between electrodes of the electronic components are reduced. Further, spacing between the electronic components can be made narrow. As a result, a region required for positioning the electronic components is reduced.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer wiring board with built-in electronic components, comprising:
a substrate comprising an insulating material and having a plurality of opening portions;
a first conductor layer formed on a surface of the substrate and having an opening portion such that the substrate has the plurality of opening portions inside the opening portion of the first conductor layer;
a plurality of electronic components positioned in the plurality of opening portions of the substrate; and
an insulating layer formed on the substrate such that the insulating layer is formed on the electronic components and on the first conductor layer,
wherein the plurality of opening portions is formed in the substrate such that the plurality of opening portions comprises at least two opening portions and that the substrate has a partition wall formed between the two opening portions, each of the opening portions has a plurality of the electronic components, and the substrate has a plurality of projections formed on the partition wall and inner wall surfaces in the plurality of opening portions such that each of the projections is positioned between the plurality of the electronic components in each of the opening portions and that the plurality of projections are formed in pairs each formed on opposite sides across each of the opening portions.

2. A multilayer wiring board according to claim 1, wherein the plurality of opening portions formed in the substrate comprises one of a plurality of recessed portions and a plurality of through holes.

3. A multilayer wiring board according to claim 1, wherein the plurality of projections is projecting such that the projections are extending parallel to long-side directions of the electronic components.

4. A multilayer wiring board according to claim 1, wherein the plurality of projections is projecting such that the projections are extending parallel to short-side directions of the electronic components.

5. A multilayer wiring board according to claim 1, wherein the plurality of projections includes projections projecting such that the projections are extending parallel to long-side directions of the electronic components and projections projecting such that the projections are extending parallel to short-side directions of the electronic components.

6. A multilayer wiring board according to claim 1, wherein the plurality of projections is formed such that each of the projections has at least one tapered surface tapering toward one end thereof.

7. A multilayer wiring board according to claim 1, wherein the plurality of projections is formed such that each of the projections has a planar shape of a semicircle or a rectangle.

8. A multilayer wiring board according to claim 1, wherein the partition wall has a surface having a width which is in a range of 300 µm or less.

9. A multilayer wiring board according to claim 1, further comprising:
a second conductor layer formed on the insulating layer; and
a plurality of via conductor structures formed through the insulating layer such that the plurality of via conductor structures is connected to the plurality of electronic components in the substrate.

10. A multilayer wiring board according to claim 1, wherein the plurality of opening portions formed in the substrate comprises the plurality of recessed portions.

11. A multilayer wiring board according to claim 1, wherein the plurality of opening portions formed in the substrate comprises the plurality of through holes.

12. A multilayer wiring board according to claim 2, wherein the plurality of projections is projecting such that the projections are extending parallel to long-side directions of the electronic components.

13. A multilayer wiring board according to claim 2, wherein the plurality of projections is projecting such that the projections are extending parallel to short-side directions of the electronic components.

14. A multilayer wiring board according to claim 2, wherein the plurality of projections includes projections projecting such that the projections are extending parallel to long-side directions of the electronic components and projections projecting such that the projections are extending parallel to short-side directions of the electronic components.

15. A multilayer wiring board according to claim 2, wherein the plurality of projections is formed such that each of the projections has at least one tapered surface tapering toward one end thereof.

16. A multilayer wiring board according to claim 2, wherein the plurality of projections is formed such that each of the projections has a planar shape of a semicircle or a rectangle.

17. A multilayer wiring board according to claim 2, wherein the partition wall has a surface having a width which is in a range of 300 µm or less.

18. A multilayer wiring board according to claim 2, further comprising:
a second conductor layer formed on the insulating layer; and
a plurality of via conductor structures formed through the insulating layer such that the plurality of via conductor structures is connected to the plurality of electronic components in the substrate.

19. A multilayer wiring board according to claim 10, wherein the plurality of projections is projecting such that the projections are extending parallel to long-side directions of the electronic components.

20. A multilayer wiring board according to claim 11, wherein the plurality of projections is projecting such that the projections are extending parallel to long-side directions of the electronic components.

* * * * *